US012793928B2

(12) United States Patent
McLaughlin et al.

(10) Patent No.: US 12,793,928 B2
(45) Date of Patent: Nov. 10, 2026

(54) THERMALLY OPTIMIZED ARC CHAMBER

(71) Applicant: Applied Materials, Inc., Santa Clara, CA (US)

(72) Inventors: Adam M. McLaughlin, Merrimac, MA (US); Craig R. Chaney, Gloucester, MA (US); Jordan B. Tye, Arlington, MA (US); James P. Buonodono, Amesbury, MA (US)

(73) Assignee: Applied Materials, Inc., Santa Clara, CA (US)

( * ) Notice: Subject to any disclaimer, the term of this patent is extended or adjusted under 35 U.S.C. 154(b) by 285 days.

(21) Appl. No.: 18/659,362

(22) Filed: May 9, 2024

(65) Prior Publication Data

US 2025/0349494 A1 Nov. 13, 2025

(51) Int. Cl.
*H01J 37/08* (2006.01)
*H01J 37/31* (2006.01)
*H01J 37/317* (2006.01)

(52) U.S. Cl.
CPC .......... *H01J 37/08* (2013.01); *H01J 37/3171* (2013.01)

(58) Field of Classification Search
CPC .............................. H01J 37/08; H01J 37/3171
See application file for complete search history.

(56) References Cited

U.S. PATENT DOCUMENTS 10,535,499 B2 1/2020 McLaughlin et al.
10,854,416 B1 12/2020 McLaughlin et al.
2003/0197129 A1* 10/2003 Murrell .................. H01J 27/08 315/111.81
2012/0013249 A1* 1/2012 Jerez ...................... H01J 37/08 313/613
2019/0139742 A1 5/2019 McLaughlin et al.
2023/0125435 A1 4/2023 Likhanskii et al.
2023/0135525 A1 5/2023 Colvin et al.

FOREIGN PATENT DOCUMENTS

CN 109216071 A 1/2019
CN 112271145 A 1/2021
JP 2007-305485 A 11/2007
TW 202335013 A 9/2023

OTHER PUBLICATIONS

International Search Report and Written Opinion mailed Jul. 30, 2025 in corresponding PCT application No. PCT/US2025/023699.

* cited by examiner

*Primary Examiner* — Nicole M Ippolito
(74) *Attorney, Agent, or Firm* — Nields, Lemack & Frame, LLC

(57) ABSTRACT

An arc chamber that includes one or more components that include a low thermal conductivity region is disclosed. The low thermal conductivity region may be formed using additive manufacturing to create a lattice pattern, stochastic infill, or hollow void. The low thermal conductivity regions are used to direct the flow of heat to desired areas, such as the faceplate of the arc chamber. The lattice pattern may be located within the end plates of the arc chamber, such that the heat from the cathode and repeller are directed toward the faceplate and away from the bottom of the arc chamber. The lattice pattern may also be located in the side walls and the bottom wall to reduce the amount of heat that is lost to the environment through conduction and radiation.

18 Claims, 10 Drawing Sheets

THERMALLY OPTIMIZED ARC CHAMBER

FIELD

Embodiments of the present disclosure relate to an arc chamber designed to achieve optimal thermal performance.

BACKGROUND

The fabrication of a semiconductor device involves a plurality of discrete and complex processes. One such process may utilize an ion beam, which may be extracted from an ion source. In an ion source, a feed gas is energized to form ions. Those ions are then extracted from the ion source through an extraction aperture disposed on a faceplate. The ions are manipulated downstream by a variety of components, including electrodes, acceleration and deceleration stages, and mass analyzers.

One such ion source is an indirectly heated cathode ion source. An indirectly heated cathode (IHC) ion source operates by supplying a current to a filament disposed behind a cathode. The filament emits thermionic electrons, which are accelerated toward the cathode via an applied electric potential, which in turn heats the cathode causing electrons to be emitted into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In some embodiments, a magnetic field is used to further confine the electrons within the arc chamber. A plurality of sides is used to connect the two ends of the arc chamber.

An extraction aperture is disposed along one of these sides, referred to as the faceplate. The extraction aperture is located proximate to the center of the arc chamber, through which the ions created in the arc chamber may be extracted.

The arc chamber is used to ionize different species to create ions. In certain embodiments, it is beneficial for the arc chamber to be maintained at a high temperature during this ionization process. This may reduce deposition on the interior walls and the extraction aperture. However, in most arc chambers, there is heat loss via radiation as well as conduction to colder components, such as the source housing.

Therefore, it would be beneficial if there was an arc chamber that was designed to reduce heat lost to radiation and conduction.

SUMMARY

An arc chamber that includes one or more components that include a low thermal conductivity region is disclosed. The low thermal conductivity region may be formed using additive manufacturing to create a lattice pattern, stochastic infill, or hollow void. The low thermal conductivity regions are used to direct the flow of heat to desired areas, such as the faceplate of the arc chamber. The lattice pattern may be located within the end plates of the arc chamber, such that the heat from the cathode and repeller are directed toward the faceplate and away from the bottom of the arc chamber. The lattice pattern may also be located in the side walls and the bottom wall to reduce the amount of heat that is lost to the environment through conduction and radiation.

According to one embodiment, an ion source is disclosed. The ion source comprises an arc chamber comprising: a first end plate; and a second end plate, positioned opposite the first end plate; the arc chamber also comprising a bottom wall, two sidewalls and a faceplate disposed between the first end plate and the second end plate; the faceplate having an extraction aperture for extraction of an ion beam; wherein at least one of the bottom wall, the two sidewalls, the first end plate or the second end plate is a component that comprises a low thermal conductivity region to limit thermal conductivity; and wherein the low thermal conductivity region comprises a lattice pattern, stochastic infill, or hollow void. In some embodiments, the lattice pattern, stochastic infill, or hollow void is disposed in an interior of the component, such that an inner surface of the component that faces an interior of the arc chamber and an opposite outer surface of the component are solid. In some embodiments, the lattice pattern, stochastic infill, or hollow void is exposed on at least one of an inner surface of the component that faces an interior of the arc chamber or an opposite outer surface of the component. In some embodiments, the ion source comprises an indirectly heated cathode ion source, and the first end plate includes a cathode opening through which a cathode passes, wherein the low thermal conductivity region is disposed in the first end plate between the cathode opening and a bottom of the first end plate, which contacts the bottom wall to reduce a flow of heat from the cathode to the bottom wall. In some embodiments, the ion source comprises an indirectly heated cathode ion source, and the first end plate includes a cathode opening through which a cathode passes, wherein the low thermal conductivity region surrounds the cathode opening on three sides to promote a flow of heat from the cathode to the faceplate. In some embodiments, the ion source comprises an indirectly heated cathode ion source, and the second end plate includes a repeller opening through which a repeller passes, wherein the low thermal conductivity region is disposed in the second end plate between the repeller opening and a bottom of the second end plate, which contacts the bottom wall to reduce a flow of heat from the repeller to the bottom wall. In some embodiments, the ion source comprises an indirectly heated cathode ion source, and the second end plate includes a repeller opening through which a repeller passes, wherein the low thermal conductivity region surrounds the repeller opening on three sides to promote a flow of heat from the repeller to the faceplate. In some embodiments, the low thermal conductivity region is disposed in the two sidewalls. In some embodiments, the low thermal conductivity region is disposed in the bottom wall. In some embodiments, the ion source also comprises a base, wherein the bottom wall of the arc chamber is disposed on the base; and a source housing on which the base is disposed; wherein the base comprises feet to reduce a surface area of the base that contacts the source housing.

According to another embodiment, an ion implantation system is disclosed. The ion implantation system comprises the ion source described above to create the ion beam; a workpiece holder; and one or more downstream components to direct the ion beam from the ion source toward the workpiece holder.

According to another embodiment, an end plate for use with an arc chamber is disclosed. The end plate comprises a plate having an inner surface, an outer surface opposite the inner surface, a top surface, a bottom surface, and two side surfaces; the plate comprising: an opening passing from the outer surface to the inner surface; and a low thermal conductivity region disposed between the opening and the bottom surface to reduce a flow of heat to the bottom surface. In some embodiments, the low thermal conductivity region is disposed between the opening and the two side surfaces to reduce a flow of heat to the two side surfaces. In some embodiments, the plate is made of a refractory metal. In some embodiments, the low thermal conductivity region comprises a lattice pattern, stochastic infill, or hollow void. In certain embodiments, the lattice pattern, stochastic infill, or hollow void is disposed in an interior of the plate, such that the inner surface and the outer surface are solid. In certain embodiments, the lattice pattern, stochastic infill, or hollow void is exposed on at least one of the outer surface or the inner surface.

According to another embodiment, an ion source is disclosed. The ion source comprises a first end plate wherein the first end plate is the end plate described above; a cathode passing through the opening in the first end plate; a second end plate; two side walls connecting the first end plate and the second end plate; a bottom wall; and a faceplate.

According to another embodiment, an ion source is disclosed. The ion source comprises a first end plate; a second end plate wherein the second end plate is the end plate described above; a repeller passing through the opening in the second end plate; two side walls connecting the first end plate and the second end plate; a bottom wall; and a faceplate.

BRIEF DESCRIPTION OF THE FIGURES

For a better understanding of the present disclosure, reference is made to the accompanying drawings, which are incorporated herein by reference and in which.

DETAILED DESCRIPTION

As described above, for certain species, it may be desirable for the arc chamber to operate at high temperatures. Further, it may be advantageous to ensure that the interior surfaces of the arc chamber and the faceplate are maintained at high temperature.

Figure 1:
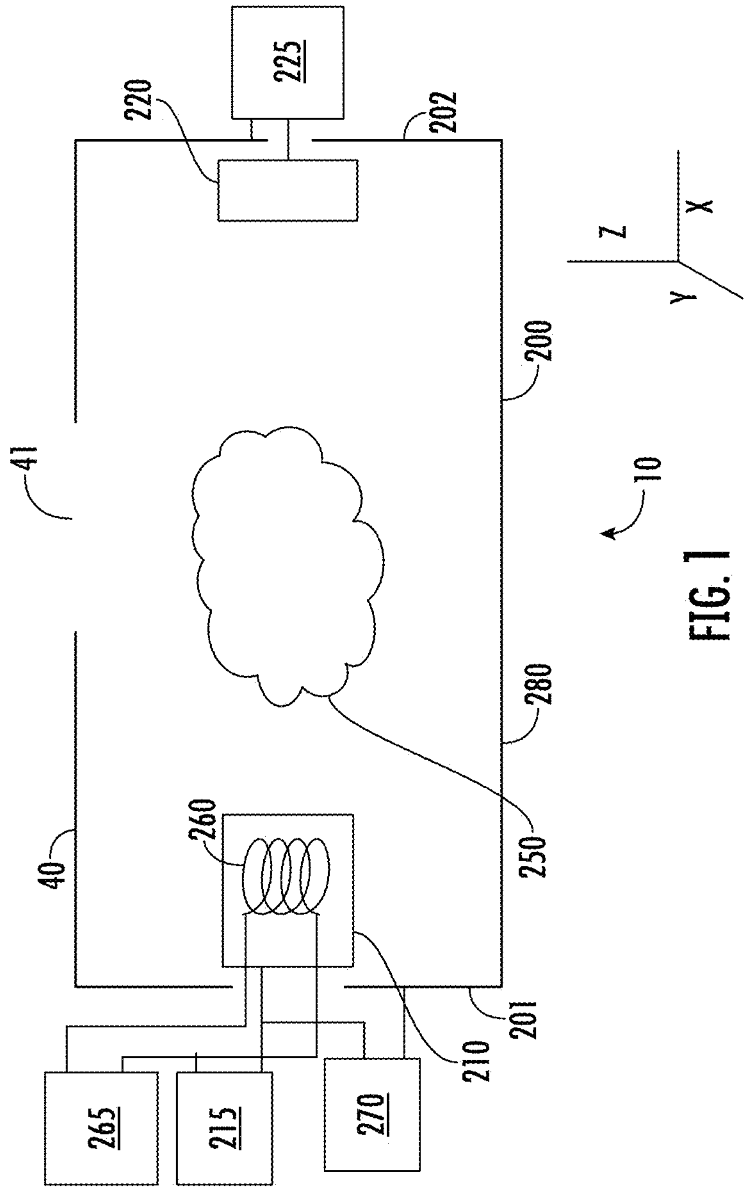
FIG. 1 is a view of the ion source according to one embodiment.

FIG. 1 shows a side view of an ion source 10 with improved thermal performance according to one embodiment. The ion source 10 includes an arc chamber 200, comprising two opposite end plates, and chamber walls connecting to these end plates. The chamber walls include a faceplate 40, and a wall opposite the faceplate 40 referred to as the bottom wall 280. Two sidewalls are used to form the rest of the arc chamber 200, and each contacts the faceplate 40, the bottom wall 280, and the two end plates. All of these components may be constructed of an electrically and thermally conductive material and may be in electrical communication with one another. In some embodiments, these components may be made of a refractory metal, such as tungsten, tantalum, or molybdenum. In other embodiments, these components may be made of graphite or a ceramic. The faceplate 40 has an extraction aperture 41 and may be disposed on the top surfaces of the two end plates and the sidewalls. The faceplate 40 may be a single component, or may be comprised of a plurality of components. For example, in one embodiment, the faceplate 40 includes a faceplate insert that is disposed beneath the outer faceplate and helps define the extraction aperture 41. Thus, the term “faceplate” as used in this disclosure refers to any component or components that make up the structure that includes the extraction aperture 41 through which the ions are removed.

Within the arc chamber 200 may be a mechanism to create ions. For example, in one embodiment, an indirectly heated cathode (IHC) may be disposed within the arc chamber 200. In this embodiment, a cathode 210 is disposed in the arc chamber 200 passing through a first end plate 201 of the arc chamber 200. A filament 260 is disposed behind the cathode 210. The filament 260 is in communication with a filament power supply 265. The filament power supply 265 is configured to pass a current through the filament 260, such that the filament 260 emits thermionic electrons. Cathode bias power supply 215 biases filament 260 negatively relative to the cathode 210, so these thermionic electrons are accelerated from the filament 260 toward the cathode 210 and heat the cathode 210 when they strike the back surface of cathode 210. The cathode bias power supply 215 may bias the filament 260 so that it has a voltage that is between, for example, 200V to 1500V more negative than the voltage of the cathode 210. The cathode 210 then emits thermionic electrons on its front surface into arc chamber 200.

Thus, the filament power supply 265 supplies a current to the filament 260. The cathode bias power supply 215 biases the filament 260 so that it is more negative than the cathode 210, so that electrons are attracted toward the cathode 210 from the filament 260. Additionally, the cathode 210 may be electrically biased relative to the arc chamber 200, using cathode power supply 270.

In this embodiment, a repeller 220 is disposed in the arc chamber 200 passing through the second end plate 202 of the arc chamber 200 opposite the cathode 210. The repeller 220 may be in communication with repeller power supply 225. As the name suggests, the repeller 220 serves to repel the electrons emitted from the cathode 210 back toward the center of the arc chamber 200. For example, the repeller 220 may be biased at a negative voltage relative to the arc chamber 200 to repel the electrons. For example, the repeller power supply 225 may have an output in the range of 0 to −150V, although other voltages may be used. In certain embodiments, the repeller 220 is biased at between 0 and −150V relative to the arc chamber 200. In other embodiments, the cathode power supply 270 is used to supply a voltage to the repeller 220 as well. In other embodiments, the repeller 220 may be electrically grounded or floating.

Figure 2:
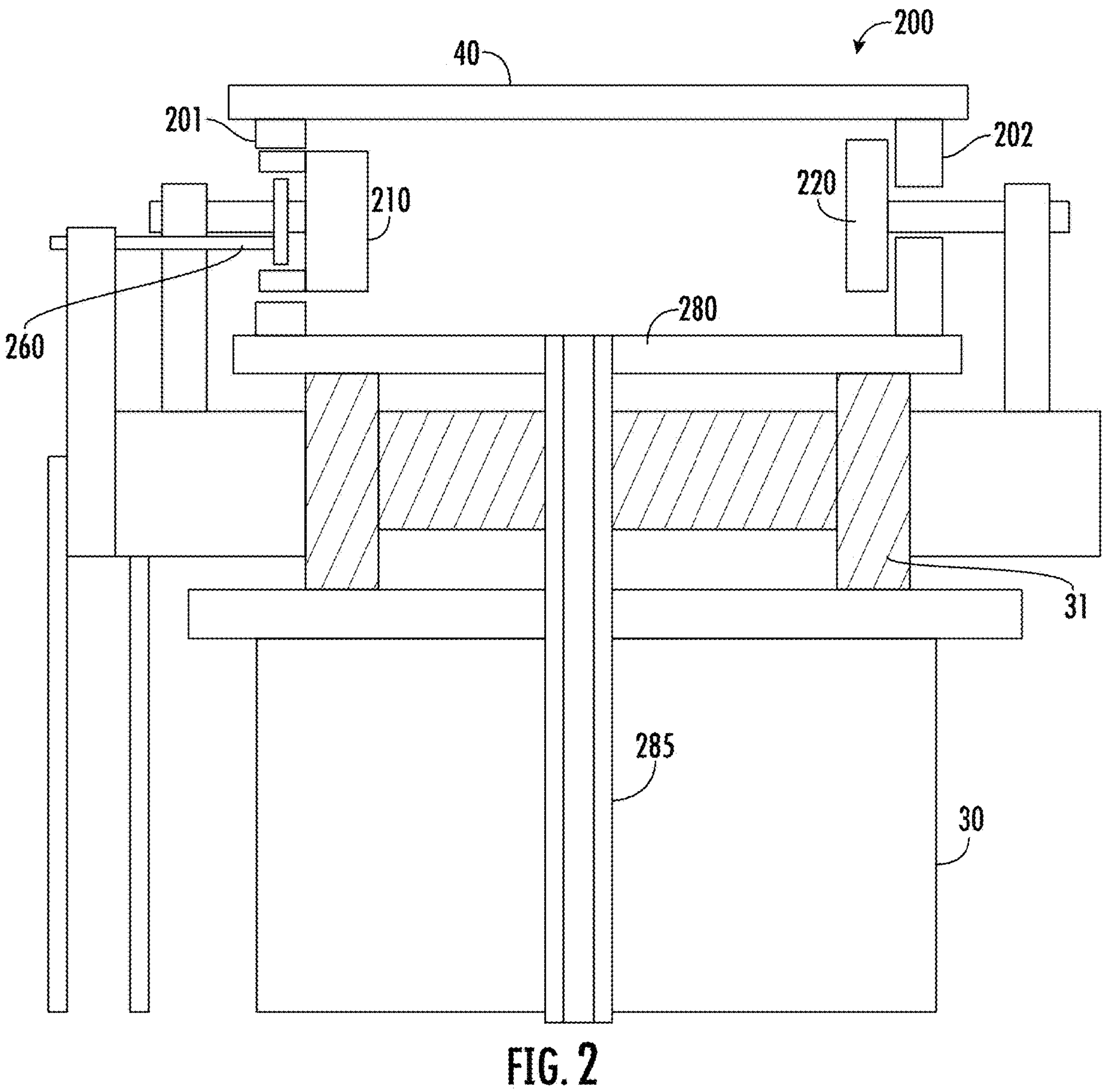
FIG. 2 shows the ion source attached to the source housing.

In operation, a gas is supplied to the arc chamber 200 through a gas conduit 285 (see FIG. 2). This gas conduit 285 may pass through the bottom wall 280. The thermionic electrons emitted from the cathode 210 cause the gas to form a plasma 250. Ions from this plasma 250 are then extracted through an extraction aperture 41 in the faceplate 40. The ions are then manipulated to form an ion beam that is directed toward the workpiece. An extraction electrode is disposed outside the arc chamber 200 and proximate the extraction aperture 41. The extraction electrode is biased at a voltage different from the arc chamber 200 so as to attract ions from within the arc chamber 200 through the extraction aperture 41.

It is noted that other mechanisms for generating ions may be used. These other mechanisms include, but are not limited to, Bernas ion sources, RF antennas, and capacitively coupled sources. As best seen in FIG. 2, the arc chamber 200 may be disposed on or attached to the source housing 30. In some embodiments, the ion source 10 may be disposed on the source housing 30 and separated from the source housing 30 by a base 31. In certain embodiments, the source housing 30 may be temperature controlled. For example, the source housing 30 may be attached to a heat sink, or may be a heat sink itself. The gas conduit 285 may pass through the source housing 30 and the base 31 and enter the arc chamber 200 through the bottom wall 280.

Most of the heat that is created in the arc chamber 200 is generated by the cathode 210 and the repeller 220. In certain embodiments, it would be advantageous to direct this heat toward the faceplate 40 and away from the source housing 30.

To do so, the first end plate 201, the second end plate 202, the bottom wall 280 and the sidewalls 500 (see FIGS. 5A-5B) may be designed to reduce the heat lost to the source housing 30 and to the environment, and increase the heat that remains in the arc chamber 200 and flows toward the faceplate 40.

The following describes the modifications to each of these components in detail. Note that, in some embodiments, many of these components may be fabricated using an additive manufacturing process. Various types of additive manufacturing processes may be employed such as laser powder bed fusion, electron beam additive manufacturing, directed energy deposition, material jetting, and others usable for use with refractory materials.

Figure 3A:
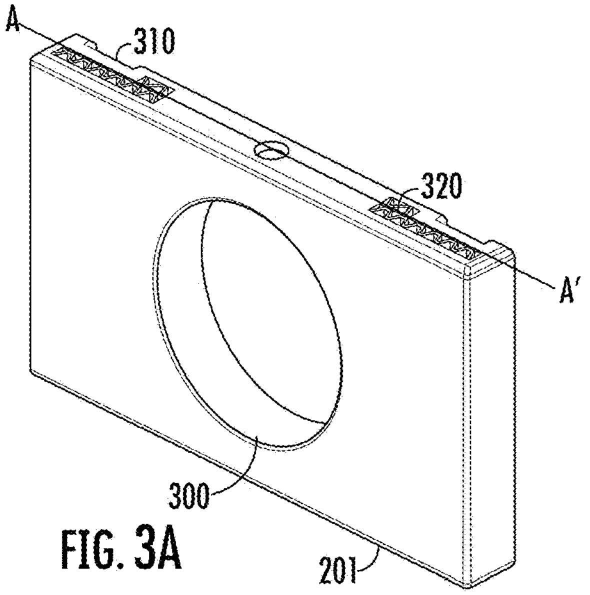
FIGS. 3A-3C show the outer surface of the first end plate of the arc chamber, a cross-section of the first end plate, and the interior surface of the first end plate, respectively.
Figure 3B:
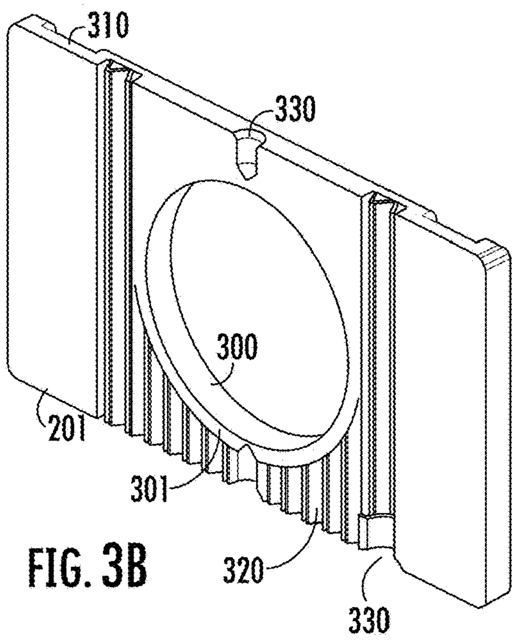
Figure 3C:
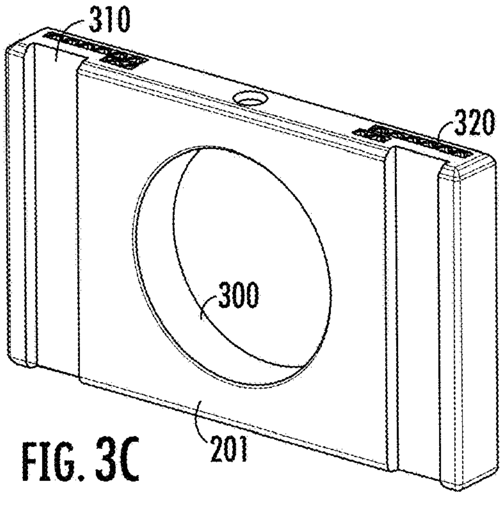

FIGS. 3A-3C show a first view of the first end plate 201, a cross-section of the first end plate 201 taken along line A-A', and a second view of the first end plate 201, respectively. The first end plate 201 includes a cathode opening 300, through which the cathode 210 is inserted. A ring 301, which is solid, is formed around the cathode opening 300. To absorb heat from the cathode 210, the ring 301 may have a thickness of roughly 0.4 inches or less. The term "ring" is used to describe the region of solid material that surrounds the cathode opening 300. In some embodiments, a portion of the ring 301 is annular, although other embodiments are possible. In this embodiment, the outer surface of the first end plate 201, which faces away from the interior of the arc chamber 200 and is shown in FIG. 3A, is smooth. The inner surface of the first end plate 201, which faces the interior of the arc chamber 200 and is shown in FIG. 3C, is also smooth, but may include two vertical notches 310. Thus, the inner and outer surfaces of the first end plate 201 may be solid material. These vertical notches 310 are used to retain the sidewalls 500. As shown in FIG. 3B, a low thermal conductivity region 320 is formed in the first end plate 201 and surrounds the ring 301 on one or more sides. In some embodiments, the low thermal conductivity region 320 comprises a lattice that is formed in the interior of the first end plate 201. In other embodiments, the low thermal conductivity region 320 may comprise a stochastic infill or hollow void. For example, the two outer surfaces of the first end plate 201 may be solid to a depth of about 0.075 inches or less, while the internal lattice may have a thickness of 0.125. Of course, these values are merely illustrative, and other dimensions are possible. In some embodiments, the low thermal conductivity region 320 is disposed between the ring 301 and the bottom of the first end plate 201, which contacts the bottom wall 280. This low thermal conductivity region 320 decreases the thermal conductivity in the downward direction, which is toward the bottom wall 280. In some embodiments, the low thermal conductivity region 320 is also disposed on either side of the ring 301, such that the low thermal conductivity region 320 surrounds the cathode opening 300 on three sides. In this way, the low thermal conductivity region 320 also decreases the thermal conductivity in the horizontal direction, which is toward the sidewalls 500. Thus, the highest thermal conductivity path is toward the faceplate 40. Further, the first end plate 201 may include one or more slots 330 along the top and bottom surfaces into which tabs may be inserted. These slots 330 may be used for pinning and alignment of connecting components.

Figure 4A:
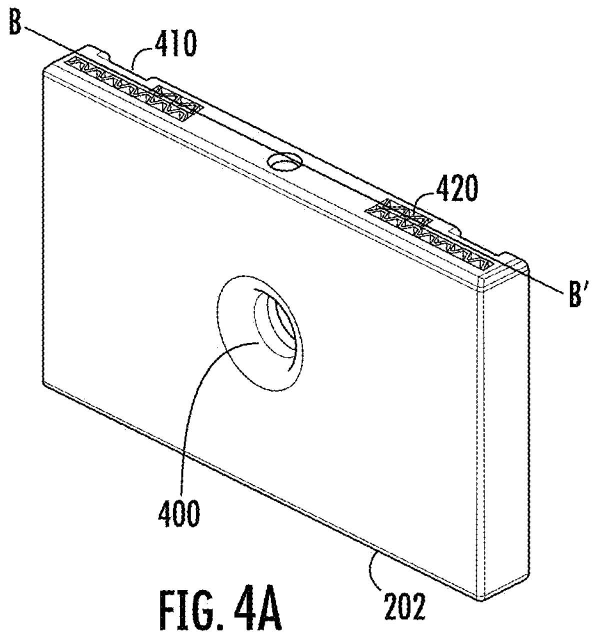
FIGS. 4A-4D show the outer surface of the second end plate of the arc chamber, a cross-section of the second end plate, and the interior surface of the second end plate according to two embodiments, respectively.
Figure 4B:
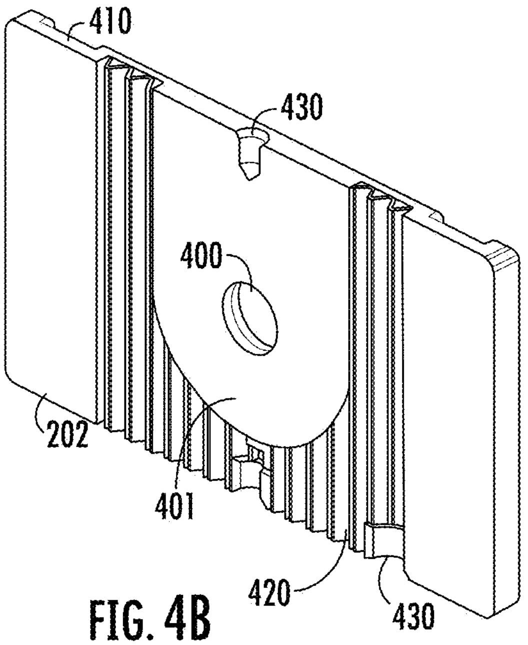
Figure 4C:
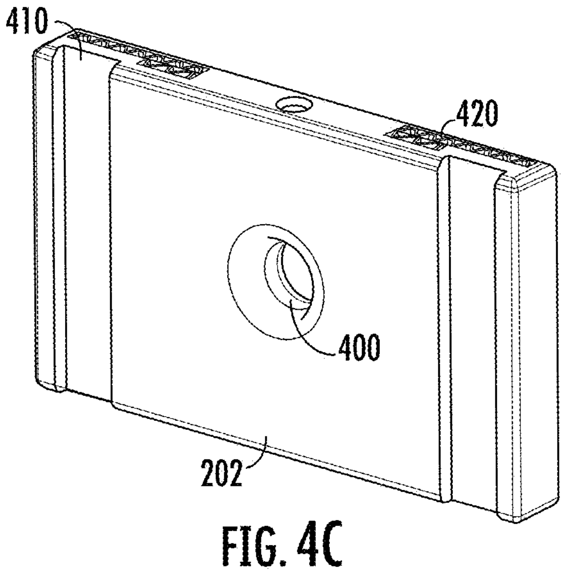

FIGS. 4A-4D show a first view of the second end plate 202, a cross-section of the second end plate taken along line B-B', and a second view of the second end plate 202 according to two embodiments, respectively. The second end plate 202 includes a repeller opening 400, through which the repeller 220 is inserted. A ring 401, which is solid, is formed around the repeller opening 400. To absorb heat from the repeller 220, the ring 301 may have a thickness that is about equal to the diameter of the repeller 220. The term "ring" is used to describe the region of solid material that surrounds the repeller opening 400. In some embodiments, a portion of the ring 301 is annular, although other embodiments are possible. In this embodiment, the outer surface of the second end plate 202, which faces away from the interior of the arc chamber 200 and is shown in FIG. 4A, is smooth. The inner surface of the second end plate 202, which faces the interior of the arc chamber 200 and is shown in FIG. 4C, is also smooth, but may include two vertical notches 410. Thus, the inner and outer surfaces of the second end plate 202 may be solid material. These vertical notches 410 are used to retain the sidewalls 500. A low thermal conductivity region 420 is formed within the second end plate 202 and surrounds the ring 401 on one or more sides. The dimensions of the wall and the interior lattice may be similar to that described above for the first end plate 201. In some embodiments, the low thermal conductivity region 420 comprises a lattice that is formed in the interior of the second end plate 202. In other embodiments, the low thermal conductivity region 420 may comprise a stochastic infill or hollow void. In some embodiments, the low thermal conductivity region 420 is disposed between the ring 401 and the bottom of the second end plate 202, which contacts the bottom wall 280. This low thermal conductivity region 420 decreases the thermal conductivity in the downward direction, which is toward the bottom wall 280. In some embodiments, the low thermal conductivity region 420 is also disposed on either side of the ring 401, such that the low thermal conductivity region 420 surrounds the repeller opening 400 on three sides. In this way, the low thermal conductivity region 420 also decreases the thermal conductivity in the horizontal direction, which is toward the sidewalls 500. Thus, the highest thermal conductivity path is toward the faceplate 40. Further, the second end plate 202 may include one or more slots 430 along the top and bottom surfaces into which tabs may be inserted. These slots 430 may be used for pinning and alignment of connecting components.

Thus, the first end plate 201 and the second end plate 202 each include an opening, and also include a low thermal conductivity region disposed between the opening and the bottom of the respective end plate, which contacts the bottom wall 280. Further, each end plate may also include a low thermal conductivity region disposed around the sides of the opening, such that the opening is surrounded by the low thermal conductivity region on three sides. In this way, the highest thermal conductivity from the opening is toward the top of the end plate, where it contacts the faceplate 40. Additionally, the inner surface that faces the interior of the arc chamber 200 and the outer surface, which is opposite the inner surface and faces away from the arc chamber, may be solid. Additionally, the end plates each have a top surface that contacts the faceplate 40, a bottom surface that contacts the bottom wall 280, and two side surfaces near the side walls 500.

Figure 5B:
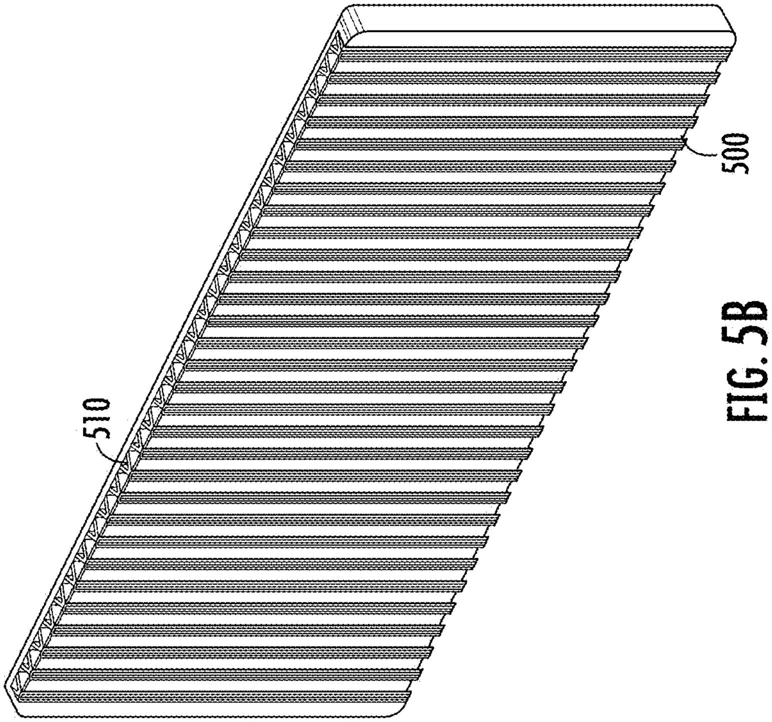
FIGS. 5A-5B show a sidewall of the arc chamber and a cross-section of the sidewall, respectively.
Figure 5A:
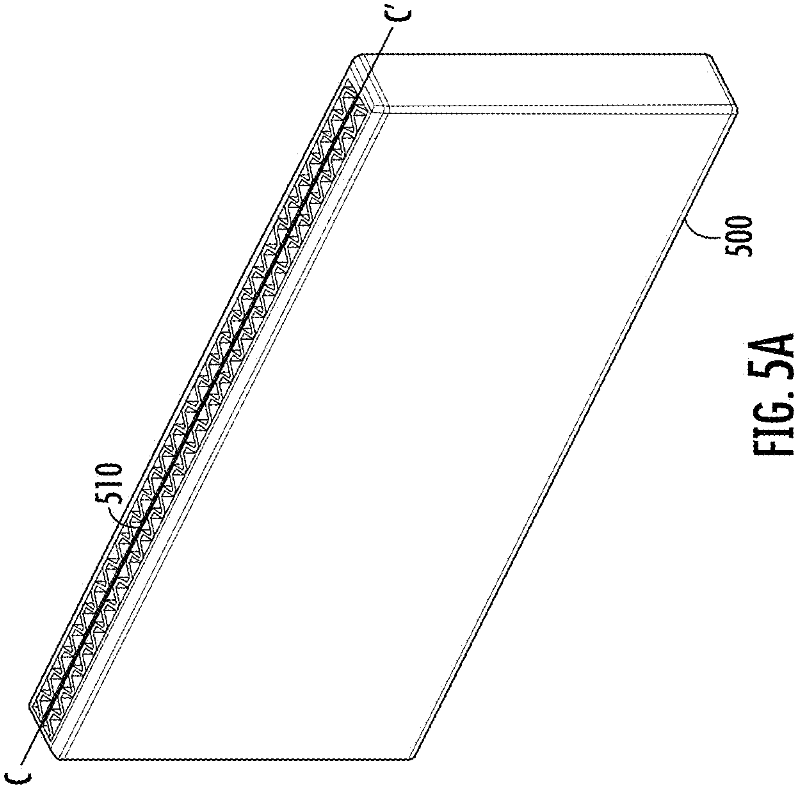

FIGS. 5A-5B show a sidewall 500 and a cross-section of the sidewall taken along line C-C', respectively. In this embodiment, the outer surface of the sidewall 500, which faces away from the interior of the arc chamber 200 and is shown in FIG. 5A, is smooth. The inner surface of the sidewall 500, which faces the interior of the arc chamber 200 is also smooth. Thus, in this embodiment, the inner and outer surfaces of the sidewall 500 may be solid material. A low thermal conductivity region 510 is formed within the interior of the sidewall 500. The dimensions of the sidewall and the interior lattice may be similar to that described above for the first end plate 201. The low thermal conductivity region 510 may extend from the bottom of the sidewall (where it contacts the bottom wall 280) to the top of the sidewall 500 (where it contacts the faceplate 40). Additionally, the low thermal conductivity region 510 may extend nearly the length of the sidewall 500, from where it contacts the first end plate 201 to where it contacts the second end plate 202. There may be regions of solid material at the ends of the sidewalls 500 where they contact the first end plate 201 and the second end plate 202. In some embodiments, the low thermal conductivity region 510 comprises a lattice that is formed in the interior of the sidewall 500. In other embodiments, the low thermal conductivity region 510 may comprise a stochastic infill or hollow void. Note that the thickness of the sidewall 500 is such that it fits in the vertical notches 310 in the first end plate 201 and the vertical notches 410 in the second end plate 202. In some embodiments, the sidewalls 500 do not have any slots, and are retained in place by the vertical notches.

Figure 6B:
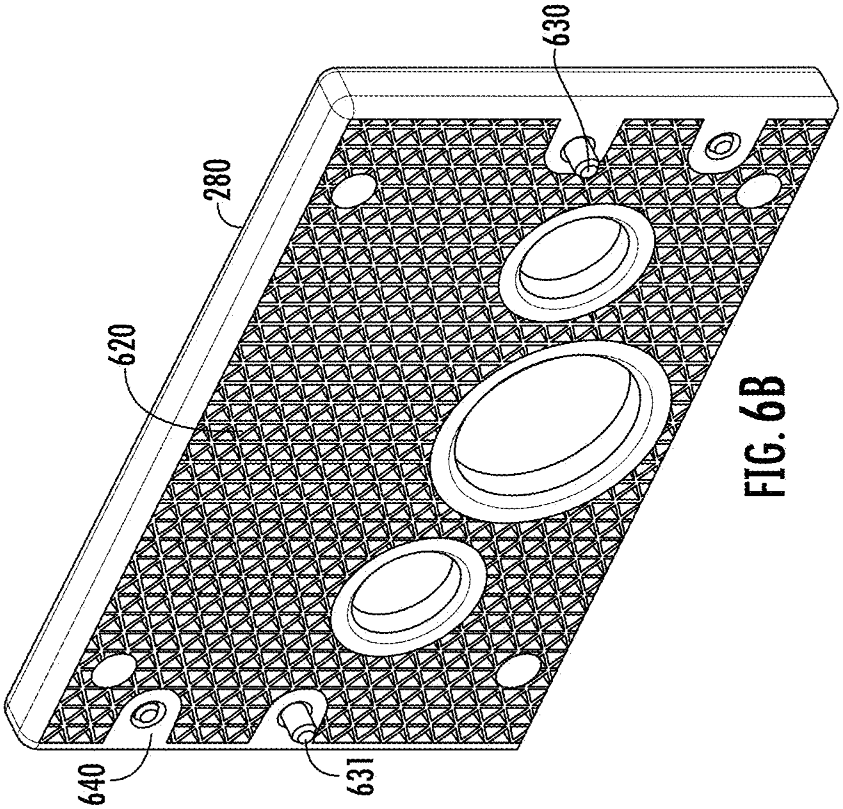
FIGS. 6A-6B show a top and bottom view of the bottom wall, respectively.
Figure 6A:
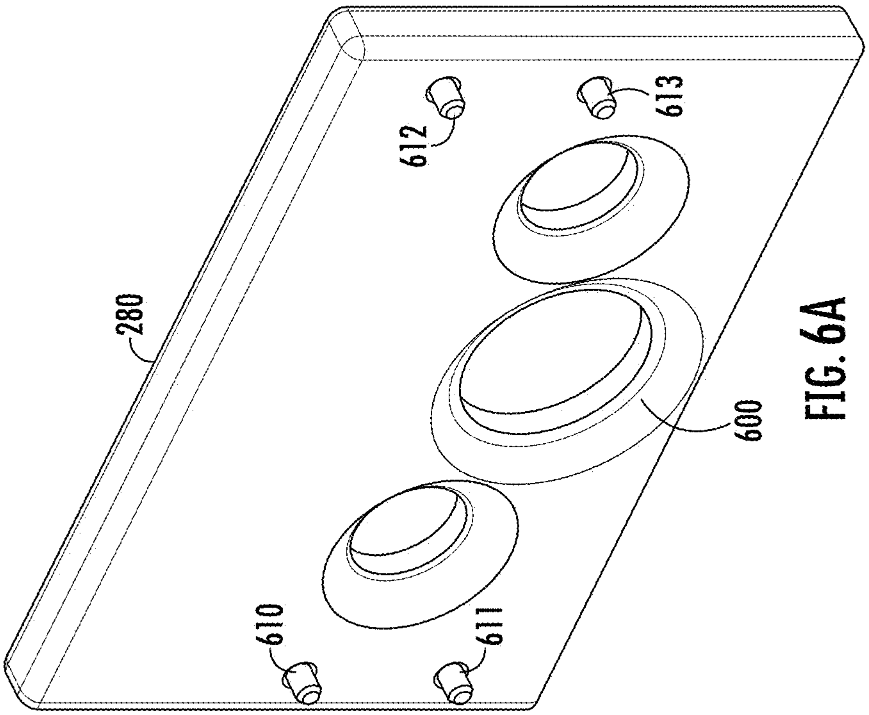

FIGS. 6A-6B show the top surface and the bottom surface of the bottom wall 280, respectively. The top surface is the surface that faces the interior of the arc chamber 200. The bottom wall 280 may include one or more openings 600 that extend through the thickness of the bottom wall 280. One or more of these openings 600 may be used for the gas conduit 285. Other openings may be used for other purposes, such as monitoring, connection to an external vaporizer and control devices. The top surface of the bottom wall 280 may be smooth, and may include a plurality of upwardly facing tabs 610-613. In FIG. 6A, two tabs 610, 611 are shown at the first end of the top surface. This set of two tabs 610, 611 is used to align and hold the first end plate 201 by insertion into the corresponding slots 330. FIG. 6A also shows two tabs 612, 613 at the second end of the top surface. This set of two tabs 612, 613 is used to align and hold the second end plate 202 by insertion into the corresponding slots 430. In some embodiments, these tabs are inserted into slots formed in the bottom wall 280. These slots may be surrounded by a region 640 of solid material. In other embodiments, the tabs may be integral with the bottom wall 280.

As shown in FIG. 6B, the bottom surface of the bottom wall 280 includes a low thermal conductivity region 620. Specifically, the top surface may be solid, but the interior of the bottom wall 280, as well as the bottom surface, comprise the low thermal conductivity regions. In one embodiment, the bottom wall 280 may be 0.250 inches thick, where 0.125 inches of that thickness are solid and the rest comprises the low thermal conductivity region 620. As noted above, the regions immediately surrounding the slots into which the tabs are inserted may be made of a solid material. Additionally, tabs 630, 631 extend downward from the bottom surface of the bottom wall 280. In one embodiment, tab 610 is longer than tab 611 such that part of tab 610 extends through the opening and also serves as tab 630. Similarly, tab 613 may be longer than tab 612 such that part of tab 613 extends through the opening and also serves as tab 631. Note that the low thermal conductivity regions may not surround the openings 600 and the openings that hold the tabs.

Note that FIG. 6B shows the bottom surface of the bottom wall 280 being a lattice. In other embodiments, the bottom surface may comprise a stochastic infill or hollow void. Note that in other embodiments, the low thermal conductivity region 620 may be disposed within the bottom wall 280 such that the bottom surface may be smooth, similar to the other components described above.

Figure 7A:
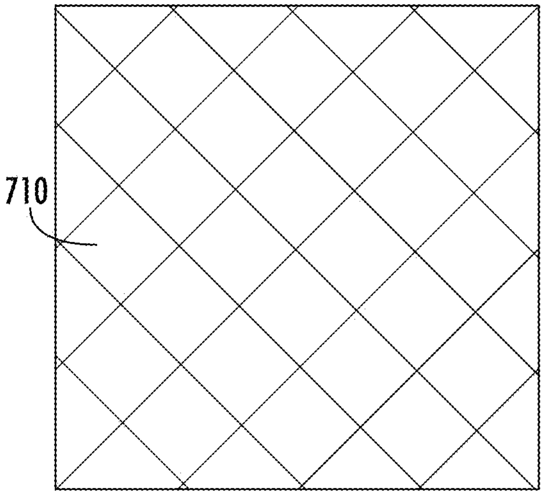
FIGS. 7A-7D show different lattice patterns.
Figure 7B:
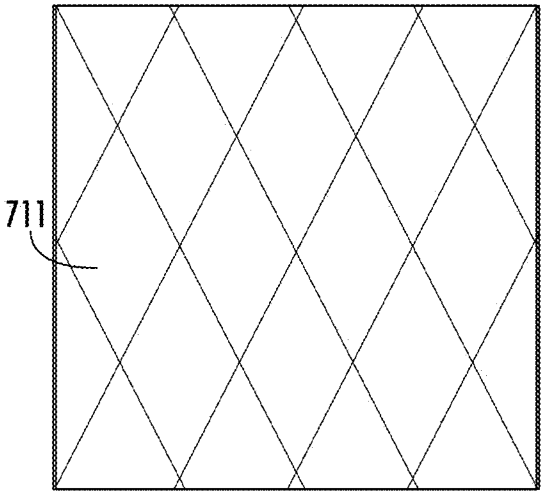
Figure 7C:
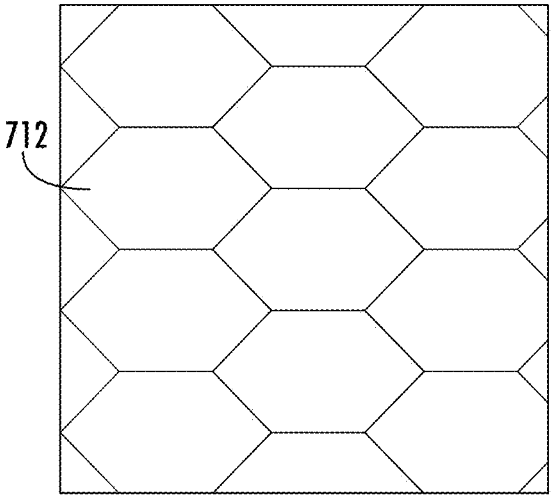
Figure 7D:
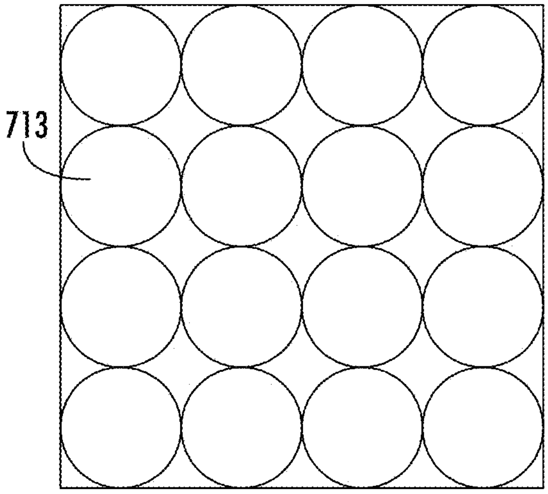

FIGS. 7A-7D show various cross-sections of a component that comprises a low thermal conductivity region. The patterns displayed in FIGS. 7A-7D may be referred to as lattices or lattice patterns. FIG. 7A shows a lattice that comprises a plurality of adjacent squares 710. Each square 710 shares a wall with an adjacent square. Thus, in this lattice, each square is surrounded by four other squares. FIG. 7B shows a lattice comprising a plurality of adjacent diamonds 711. Like FIG. 7A, each diamond 711 shares a wall with an adjacent diamond. Thus, each diamond is surrounded by four other diamonds. FIG. 7C shows a lattice comprising a plurality of adjacent hexagons 712. Each hexagon 712 shares a wall with an adjacent hexagon. Thus, in this lattice, each hexagon is surrounded by six other hexagons. FIG. 7D shows a lattice comprising a plurality of adjacent circles 713. Of course, lattices may be formed with other shapes, such as octagons, pentagons, ovals, ellipses and irregular shapes. Further, the lattices may be formed using two or more different shapes. The selection of a lattice pattern may be based on the desired strength, weight and other factors. These lattice patterns may define the low thermal conductivity region of the component. The lattice shown in FIGS. 7A-7D may be arranged in any orientation, such as the horizontal direction, the vertical direction or a combination thereof. For example, the lattice in FIGS. 3A-3B, 4A-4B, and 5A-5B extends in the vertical direction, from one end of the component to the opposite end. In contrast, the lattice in FIGS. 6A-6B extends in the horizontal direction, from one side of the component to the opposite side. Further, the lattice pattern may be periodic and regular, indicating that all shapes are equally sized and shaped. In other embodiments, the lattice pattern may vary. For example, in some regions, the lattice pattern may include smaller shapes that are more closely spaced, while in another region, the shapes may be larger and spaced further away. In this way, the thermal conductivity may vary within the lattice pattern. Thus, the lattice pattern may also be non-periodic and non-regular.

Figure 8:
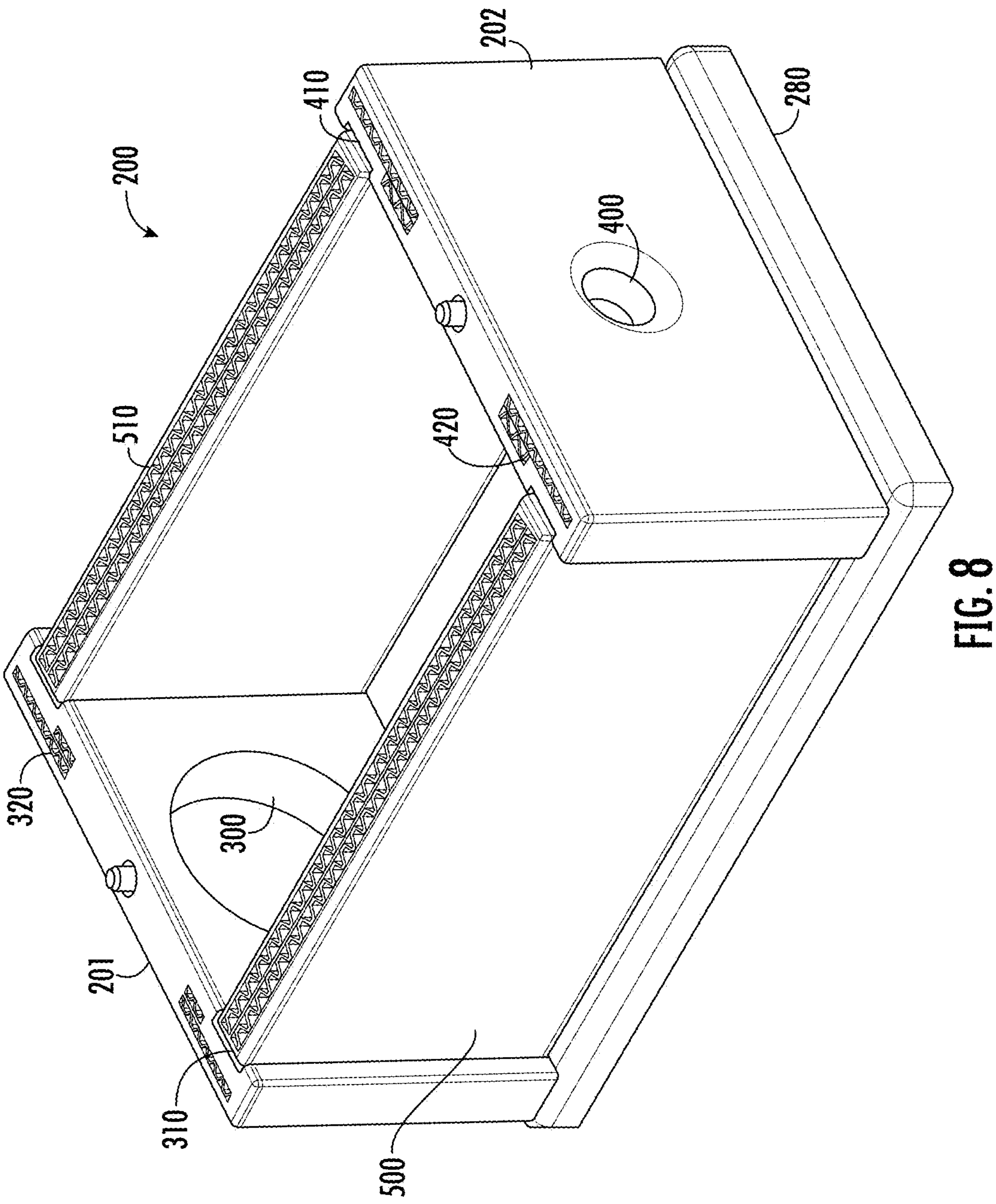
FIG. 8 shows an assembled arc chamber.

FIG. 8 shows the assembled arc chamber 200. The sidewalls 500 are held in place by their placement within vertical notches 310, 410. Further, as seen in FIG. 8, the internal lattice of the first end plate 201, the second end plate 202 and the sidewalls 500 extends through the center of their respective components to the top surface of each. Further, note that the regions immediately above the cathode opening 300 and the repeller opening 400 are solid material to maximize thermal conductivity to the faceplate 40. The first end plate 201 is held in place by tabs 610, 611, while the second end plate 202 is held in place by tabs 612, 613 (not shown).

Figure 4D:
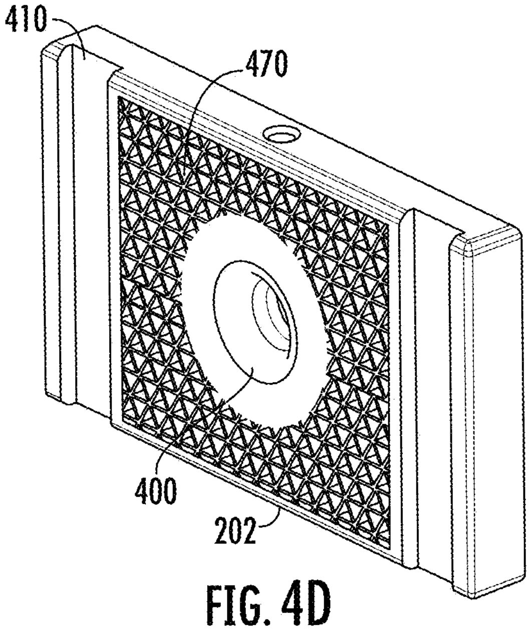

While the figures show the inner and outer surfaces of many of the components as being smooth and solid, other embodiments are also possible. For example, in some embodiments, the low thermal conductivity regions may extend to an exterior surface. For example, FIG. 4D shows the inner surface of the second end plate 202 according to another embodiment. Note that in this embodiment, the low thermal conductivity regions 470 are exposed on the inner surface that faces the interior of the arc chamber 200. Similarly, in some embodiments, the low thermal conductivity regions may be exposed on the inner surface of the first end plate 201.

Alternatively or additionally, the low thermal conductivity regions may be exposed on the outer surfaces of the first end plate 201 and/or the second end plate 202.

Further, this configuration may also be applied to the sidewalls 500. For example, the view shown in FIG. 5B may represent the inner surface and/or the outer surface in some embodiments.

Figure 9:
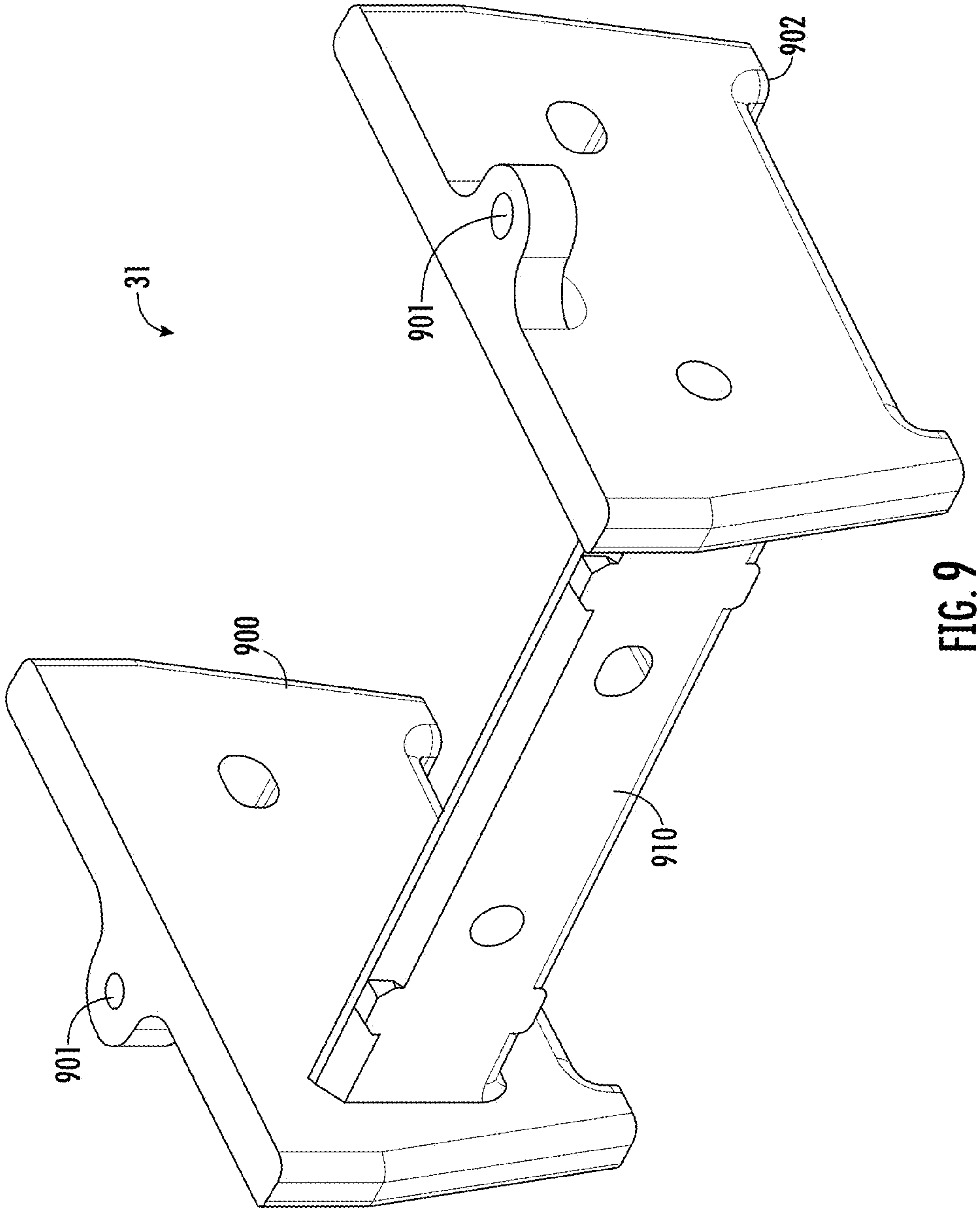
FIG. 9 shows a base according to one embodiment.

FIG. 9 shows the base 31 on which the arc chamber 200 is disposed. The base 31 has two legs 900. Each leg 900 has a hole 901 located on its top surface. These holes 901 are used to capture tabs 630, 631 (see FIG. 6B). Additionally, each leg 900 may include feet 902 located on its bottom surface. These feet 902 reduce the thermal conductivity between the base 31 and the source housing 30, on which the base 31 is mounted. In some embodiments, the feet 902 reduce the surface area of the base 31 that contacts the source housing 30 by between 20% and 90%, as compared to a design without feet.

Additionally, the base 31 includes a cross member 910 that extends between the two legs 900 and provides structural support. The cross member 910 is suspended above the source housing 30 and does not contact the source housing 30.

In summary, the ion source 10 described herein has an arc chamber 200 wherein the first end plate 201, the second end plate 202, the two sidewalls 500 or the bottom wall 280 is a component that includes a low thermal conductivity region.

Figure 10:
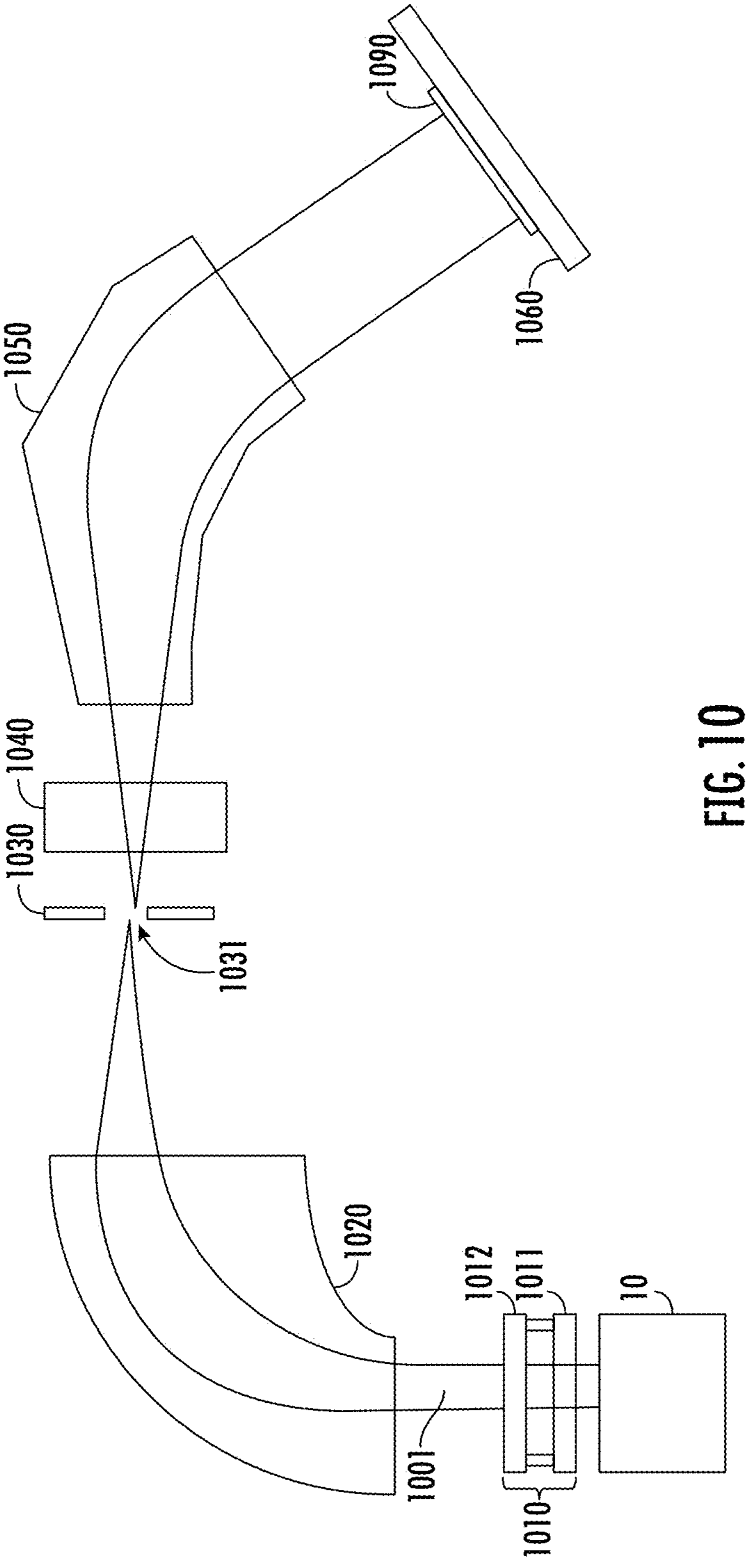
FIG. 10 shows an ion implantation system that employs the ion source described herein.

The ion source 10 described herein may be used in an ion implantation system, such as that shown in FIG. 10. Disposed outside and proximate the extraction aperture 41 of the ion source 10 are extraction optics 1010. In certain embodiments, the extraction optics 1010 comprise one or more electrodes, including extraction electrode 1011. In certain embodiments, the extraction optics 1010 may comprise a second electrode 1012 which may be biased at a different voltage than extraction electrode 1011. In some embodiments, in excess of two electrodes, such as three electrodes or four electrodes may be employed. In these embodiments, the electrodes may be functionally and structurally similar to those described above, but may be biased at different voltages.

Located downstream from the extraction optics 1010 is a mass analyzer 1020. The mass analyzer 1020 uses magnetic fields to guide the path of the extracted ions 1001. The magnetic fields affect the flight path of ions according to their mass and charge. A mass resolving device 1030 that has a resolving aperture 1031 is disposed at the output, or distal end, of the mass analyzer 1020. By proper selection of the magnetic fields, only those extracted ions 1001 that have a selected mass and charge will be directed through the resolving aperture 1031. Other ions will strike the mass resolving device 1030 or a wall of the mass analyzer 1020 and will not travel any further in the system.

One or more beamline components may be disposed downstream from the mass resolving device 1030. For example, a collimator 1040 may be disposed downstream from the mass resolving device 1030. The collimator 1040 accepts the extracted ions 1001 that pass through the resolving aperture 1031 and creates a ribbon ion beam formed of a plurality of parallel or nearly parallel beamlets. In other embodiments, the ion beam may be a spot beam. In this embodiment, an electrostatic scanner is used to move the spot beam in a first direction, as defined below.

Located downstream from the collimator 1040 may be an acceleration/deceleration stage 1050. The acceleration/deceleration stage 1050 may be an electrostatic filter. The electrostatic filter is a beam-line lens component configured to independently control deflection, deceleration, and focus of the ion beam. The output from the acceleration/deceleration stage 1050 may be a ribbon ion beam having a width in the first direction, which is much greater than its height in the second direction. Located downstream from the acceleration/deceleration stage 1050 is the workpiece holder 1060.

The workpiece 1090, which may be, for example, a silicon wafer, a silicon carbide wafer, or a gallium nitride wafer, is disposed on the workpiece holder 1060. The workpiece holder 1060 may be moved in the second direction, which is perpendicular to the first direction, to allow the entirety of the workpiece 1090 to be processed by the ion beam.

The embodiments described above in the present application may have many advantages. The cathode 210 and the repeller 220 generate much of the heat within the arc chamber 200. In certain embodiments, it is advantageous to use this heat to maintain the arc chamber at an elevated temperature and to increase the temperature of the faceplate 40 to prevent the deposition of material along the extraction aperture 41. By forming the first end plate 201 and the second end plate 202 with an internal lattice, it is possible to direct the heat from the cathode 210 and the repeller 220 to flow toward the faceplate 40. Additionally, by incorporating an internal lattice in the sidewalls 500, the amount of heat that is radiated outward through the sidewalls is decreased, which helps maintain the arc chamber 200 at the elevated temperature. Lastly, by incorporating lattice into the bottom wall 280 and using feet 902 on the base 31, the amount of heat that flows to the source housing 30 may be reduced.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:

an arc chamber comprising:

a first end plate; and a second end plate, positioned opposite the first end plate; the arc chamber also comprising a bottom wall, two sidewalls and a faceplate disposed between the first end plate and the second end plate; the faceplate having an extraction aperture for extraction of an ion beam;

wherein at least one of the bottom wall, the two sidewalls, the first end plate or the second end plate is a component that comprises a low thermal conductivity region to limit thermal conductivity; and wherein the low thermal conductivity region comprises a lattice pattern, stochastic infill, or hollow void disposed in an interior of the component.

2. The ion source of claim 1, wherein an inner surface of the component that faces an interior of the arc chamber and an opposite outer surface of the component are solid.

3. The ion source of claim 1, wherein the lattice pattern, stochastic infill, or hollow void is exposed on at least one of an inner surface of the component that faces an interior of the arc chamber or an opposite outer surface of the component.

4. The ion source of claim 1, wherein the ion source comprises an indirectly heated cathode ion source, and wherein the first end plate includes a cathode opening through which a cathode passes, wherein the low thermal conductivity region is disposed in the first end plate between the cathode opening and a bottom of the first end plate, which contacts the bottom wall to reduce a flow of heat from the cathode to the bottom wall.

5. The ion source of claim 1, wherein the ion source comprises an indirectly heated cathode ion source, and wherein the first end plate includes a cathode opening through which a cathode passes, wherein the low thermal conductivity region surrounds the cathode opening on three sides to promote a flow of heat from the cathode to the faceplate.

6. The ion source of claim 1, wherein the ion source comprises an indirectly heated cathode ion source, and wherein the second end plate includes a repeller opening through which a repeller passes, wherein the low thermal conductivity region is disposed in the second end plate between the repeller opening and a bottom of the second end plate, which contacts the bottom wall to reduce a flow of heat from the repeller to the bottom wall.

7. The ion source of claim 1, wherein the ion source comprises an indirectly heated cathode ion source, and wherein the second end plate includes a repeller opening through which a repeller passes, wherein the low thermal conductivity region surrounds the repeller opening on three sides to promote a flow of heat from the repeller to the faceplate.

8. The ion source of claim 1, wherein the low thermal conductivity region is disposed in the two sidewalls.

9. The ion source of claim 1, wherein the low thermal conductivity region is disposed in the bottom wall.

10. The ion source of claim 1, further comprising:

a base, wherein the bottom wall of the arc chamber is disposed on the base; and a source housing on which the base is disposed;

wherein the base comprises feet to reduce a surface area of the base that contacts the source housing.

11. An ion implantation system, comprising:

the ion source of claim 1 to create the ion beam;

a workpiece holder; and one or more downstream components to direct the ion beam from the ion source toward the workpiece holder.

12. An end plate for use with an arc chamber, comprising:

a plate having an inner surface, an outer surface opposite the inner surface, a top surface, a bottom surface, and two side surfaces;

the plate comprising:

an opening passing from the outer surface to the inner surface; and a low thermal conductivity region disposed between the opening and the bottom surface to reduce a flow of heat to the bottom surface, wherein the low thermal conductivity region comprises a lattice pattern, stochastic infill, or hollow void disposed in an interior of the plate.

13. The end plate of claim 12, wherein the low thermal conductivity region is disposed between the opening and the two side surfaces to reduce a flow of heat to the two side surfaces.

14. The end plate of claim 12, wherein the 14, plate is made of a refractory metal.

15. The end plate of claim 12, wherein the inner surface and the outer surface are solid.

16. The end plate of claim 12, wherein the lattice pattern, stochastic infill, or hollow void is exposed on at least one of the outer surface or the inner surface.

17. An ion source, comprising:

a first end plate, wherein the first end plate comprises the end plate of claim 12;

a cathode passing through the opening in the first end plate;

a second end plate;

two side walls connecting the first end plate and the second end plate;

a bottom wall; and a faceplate.

18. An ion source, comprising:

a first end plate;

a second end plate, wherein the second end plate comprises the end plate of claim 12;

a repeller passing through the opening in the second end plate;

two side walls connecting the first end plate and the second end plate;

a bottom wall; and a faceplate.

* * * * *